United States Patent
Cheng-I Fang et al.

(10) Patent No.: US 6,661,223 B2
(45) Date of Patent: Dec. 9, 2003

(54) METHOD OF TESTING FOR RESPONSE ABNORMALITIES IN A MAGNETIC SENSOR

(75) Inventors: Peter Cheng-I Fang, San Jose, CA (US); Christopher Dana Keener, San Jose, CA (US); Kenneth Donald Mackay, San Jose, CA (US); Frederick William Stukey, Jr., San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/041,282

(22) Filed: Jan. 7, 2002

(65) Prior Publication Data

US 2003/0128025 A1 Jul. 10, 2003

(51) Int. Cl.[7] .................. G01R 35/00; G01R 33/12
(52) U.S. Cl. ............... 324/210; 324/202; 324/228
(58) Field of Search .................. 324/202, 210–212, 324/225, 222, 223, 252, 228; 702/104; 360/31

(56) References Cited

U.S. PATENT DOCUMENTS

| 5,514,953 A | 5/1996 | Schultz et al. ............... 324/228 |
| 5,559,431 A | 9/1996 | Sellen ........................ 324/202 |
| 5,617,278 A | 4/1997 | Cheng et al. ................ 360/126 |
| 5,644,225 A | 7/1997 | Alfors et al. ................ 324/202 |
| 5,668,470 A | 9/1997 | Shelor ........................ 324/202 |
| 5,917,321 A | 6/1999 | Pokrowsky et al. ......... 324/235 |
| 6,014,282 A | 1/2000 | Ito .............................. 360/75 |
| 6,275,028 B1 | 8/2001 | Matsui et al. ............... 324/210 |
| 6,304,081 B1 | 10/2001 | Richter ....................... 324/210 |
| 6,479,988 B2 | 11/2002 | Hachisuka et al. .......... 324/210 |

FOREIGN PATENT DOCUMENTS

| JP | 06-084148 | 3/1994 | ........... G11B/5/455 |
| SU | 834750 | 5/1981 | ........... G11B/5/46 |
| SU | 1663589 | 7/1991 | ........... G01R/33/12 |

OTHER PUBLICATIONS

IBM Technical Disclosure Bulletin Feb. 1994, vol. 37, Issue 2A, pp. 55–56.

*Primary Examiner*—N. Le
*Assistant Examiner*—Darrell Kinder
(74) *Attorney, Agent, or Firm*—Lewis L. Nunnelley; William D. Gill

(57) ABSTRACT

A method is disclosed for determining the presence of response abnormalities in magnetic sensors. The method includes placing the sensor in an applied magnetic field and collecting sensor resistance information as the magnitude and direction of the applied field is altered. The resistance values are then examined to determine the presence of response abnormalities.

7 Claims, 11 Drawing Sheets

METHOD OF TESTING FOR RESPONSE ABNORMALITIES IN A MAGNETIC SENSOR

BACKGROUND OF THE INVENTION

1. Field of the Invention

The present invention relates generally to magnetic sensors used in hard disk drives incorporated in computer systems; and more specifically to a method of testing for magnetic sensor response abnormalities.

2. Description of the Background Art

Magnetic sensors used to read the recorded information previously written on a disk in a disk drive are expected to meet several performance criteria. One of the most important criterion is that the response of the sensor be predictable and free from nonlinear response abnormalities. It is desirable to be able to evaluate the sensors for these abnormalities. The method used for evaluation must be fast, inexpensive, and above all reliable in identifying those sensors which have response abnormalities.

Sensors used today in disk drive applications are either magnetoresistive (MR) or giant magnetoresistive (GMR) sensors. The latter are also known as spin valve sensors. Tunnel junction sensors are also being developed for use in disk drives. All of these sensors are constructed by forming multiple layers of thin films. The sensor output changes in response to the magnitude of an external magnetic field. Within the disk drive the external magnetic field comes from the written transitions on the disk. When testing sensors outside of a disk drive, the external magnetic field is provided by a coil or other means.

In order to be useful, the response of the sensor must be reasonably linear with respect to changes in the applied field. Some of the thin films in the sensor are magnetic and therefore are subject to anomalous magnetic behavior. For example the sensor may exhibit Barkhausen abrupt domain movement in the magnetic films within the sensor. A transfer curve, also called a transfer function, is a plot of sensor output, either voltage or resistance, vs. applied field magnitude. A Barkhausen domain movement can be identified by observing a discontinuity, also called a jump, in a transfer curve. A kink is similar to a jump but is observed as a more gradual discontinuity in the transfer curve. Another type of undesirable sensor behavior is observed as an open loop in the transfer curve. Open loops occur when the films within the sensor are magnetically switched through a hysteresis loop. Open loops are also nonlinear response abnormalities in the transfer curve. Nonlinear response abnormalities can cause errors when detecting magnetic transitions on a disk. The ability of removing the sensors which have response abnormalities from the general population of sensors results in an improvement in the overall quality of the group of sensors which is subsequently placed in disk drives.

It is known to test for the presence of sensor response abnormalities by placing the sensor in a magnetic field and monotonically increasing the magnitude of the field while measuring the resistance. When the resistance of the sensor abruptly changes value over a small difference in applied field magnitude, the sensor has a nonlinear response abnormality and is considered defective. One shortcoming of this method is that some sensors which have response abnormalities are not discovered. While the response abnormality of a large sensor tends to be sharp and well defined, a typical response abnormality of a small sensor is more gradual making detection more difficult. This is a particularly serious shortcoming since future sensors will be much smaller in order to support higher recording densities.

What is needed is a testing method to determine the presence of sensor response abnormalities which is efficient, reliable, and works well with small sensors.

SUMMARY OF THE INVENTION

In a preferred embodiment, the invention provides for a testing method which is efficient in detecting sensor response abnormalities. Furthermore one embodiment of the invention is capable of detecting the presence of abnormalities which are not well defined.

In a preferred embodiment of the present invention, the value of the applied magnetic field is incrementally changed and the direction of the applied magnetic field is alternated at each magnetic field value. The detectability of any response abnormality is substantially improved when using an alternating field to excite the sensor.

Another embodiment of the present invention provides an improved method for the efficient detection of subtle and ill-defined response abnormalities by examining the departure of the transfer curve of the sensor from an ideal linear transfer curve. In another embodiment of the present invention, multiple values of the sensor voltage or resistance values are measured at each field value and the range of sensor values are examined to indicate abnormalities.

Other aspects and advantages of the present invention will become apparent from the following detailed description which when taken in conjunction with the accompanying drawings illustrate by way of example the principles of the invention.

DETAILED DESCRIPTION OF THE INVENTION

The method of testing for response abnormalities in magnetic sensors involves alternating the polarity of the applied field and using an improved method to examine the data for the abnormalities. The present method is more effective in identifying sensors with response abnormalities than the prior art process of using a monotonically increasing applied field and simply inspecting the data for a large change in sensor output.

Figure 1:
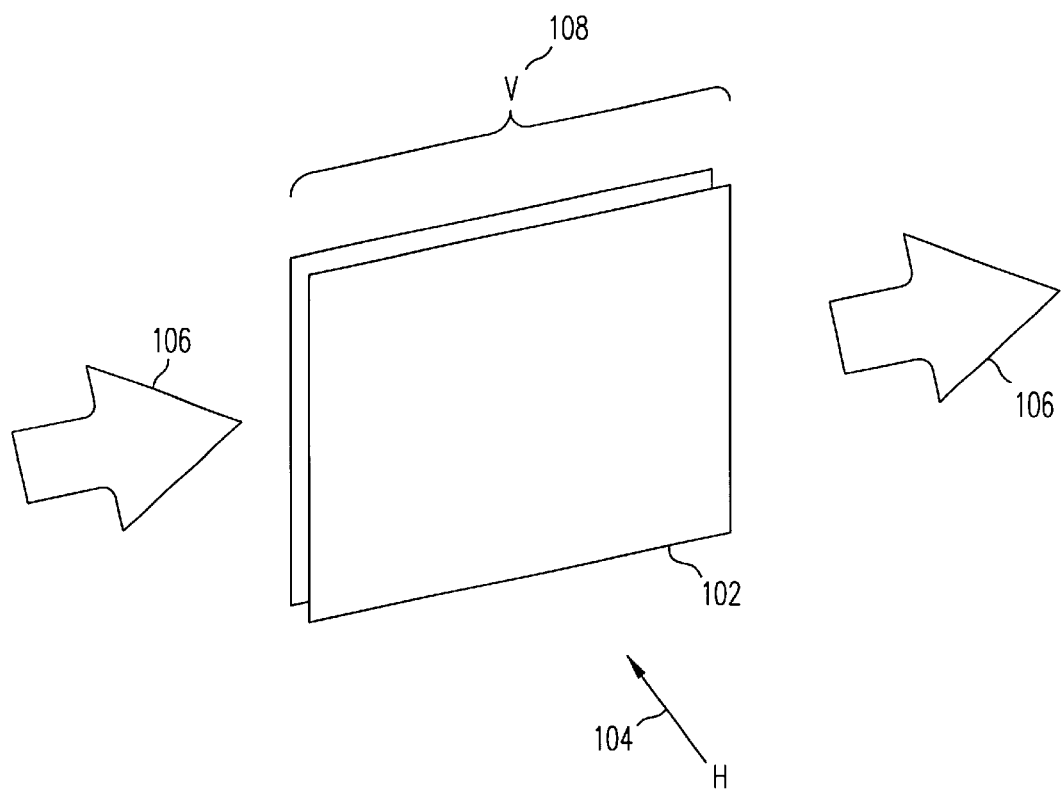
FIG. 1 shows the placement of a magnetic sensor in a magnetic field.

FIG. 1 shows a diagram of the sensor 102 in an applied magnetic field 104. The bias current 106 is also shown. The resistance of the sensor 102 is typically measured by passing a constant bias current 106 through the sensor 102 and measuring the voltage 108 across the sensor 102. The output of the sensor can be reported as voltage or equivalently as resistance of the sensor. The magnetic field 104 can be generated by several known techniques such as using a Helmholz coil or using a coil wrapped around a ferromagnetic material such as iron. Prior to testing the sensor is typically lapped to the correct stripe height. The measurements may be conducted on sensors which are incorporated in rows of lapped sliders, individual sliders containing a single sensor, a finished head-gimbal assembly having a sensor, or an assembly of head-gimbals.

Figure 2:
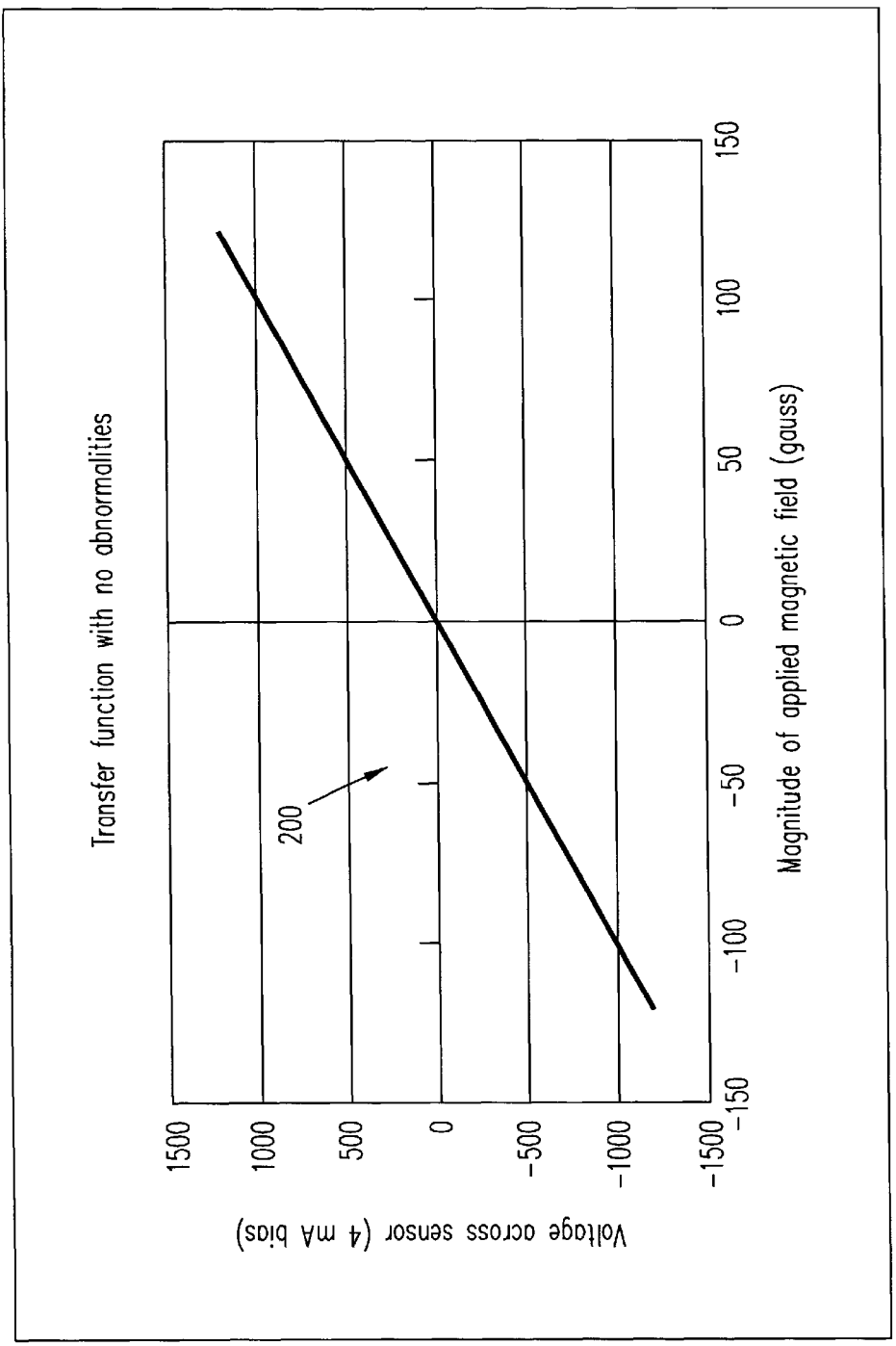
FIG. 2 shows a transfer curve with no response abnormalities.

FIG. 2 shows a plot of a transfer curve 200 for a typical sensor which does not show any magnetic response abnormality. The output was measured as voltage with a constant current of 4 mA passed through the sensor. The output of the sensor is linear with respect to the magnitude of the applied field. For typical disks, the field magnitude originating from a written transition is about 70 to 100 Oersteds. Suitably, the maximum applied field used in the measurement of the transfer curve, typically about 120 Oersteds, is chosen to be somewhat higher than the field from the disk.

Figure 3:
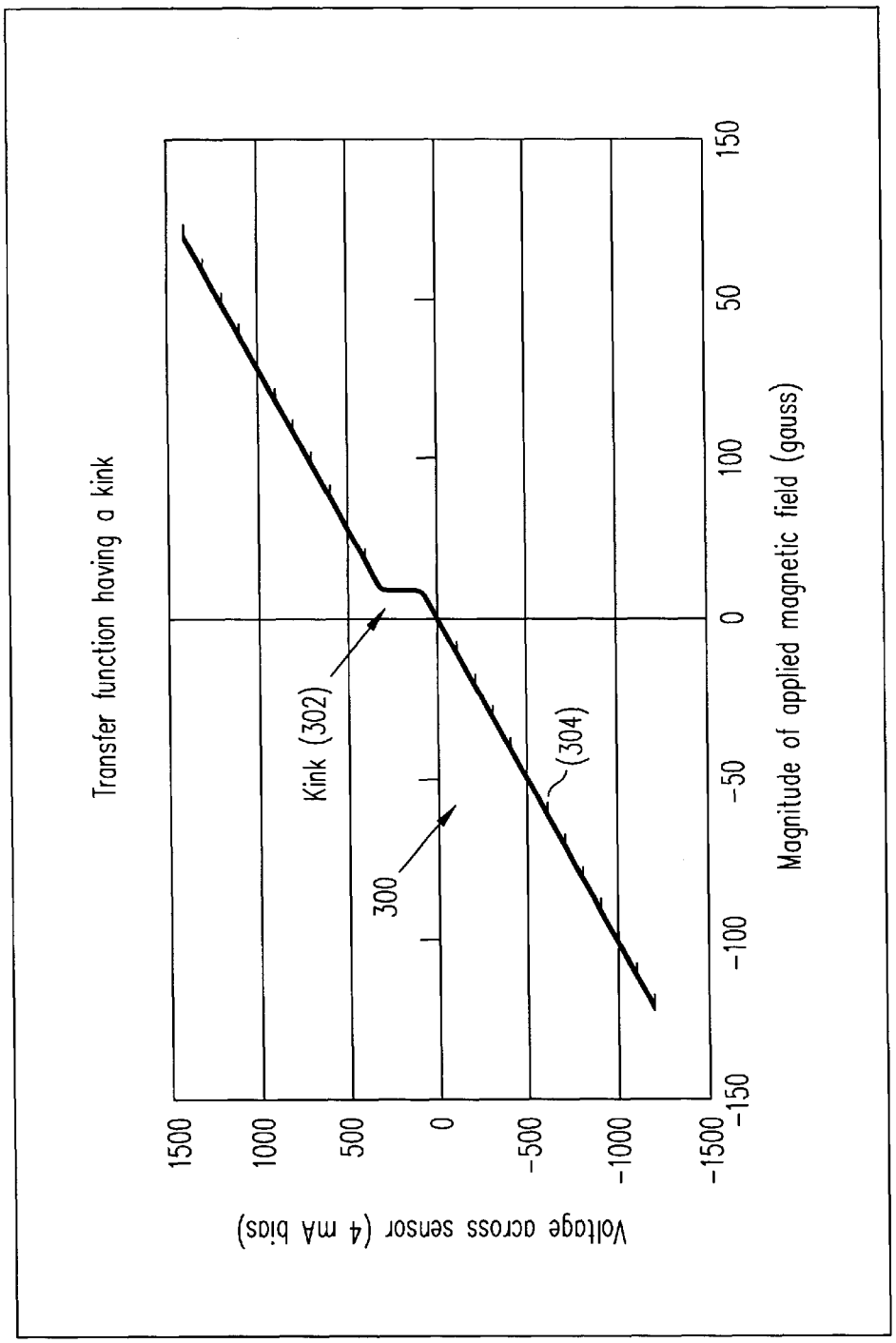
FIG. 3 shows a transfer curve having a kink.

FIG. 3 shows an example of a typical transfer curve 300 of a sensor which shows a kink 302. Kinks can range from being steps or jumps in the transfer curve to more slowly varying changes. If the sensor is relatively large a kink in the transfer curve typically occurs over a small change in the magnitude of the applied field. Accordingly the slope of the region of the transfer curve 300 where the kink 302 occurs is large compared with the average slope 304 of the transfer curve.

Figure 4:
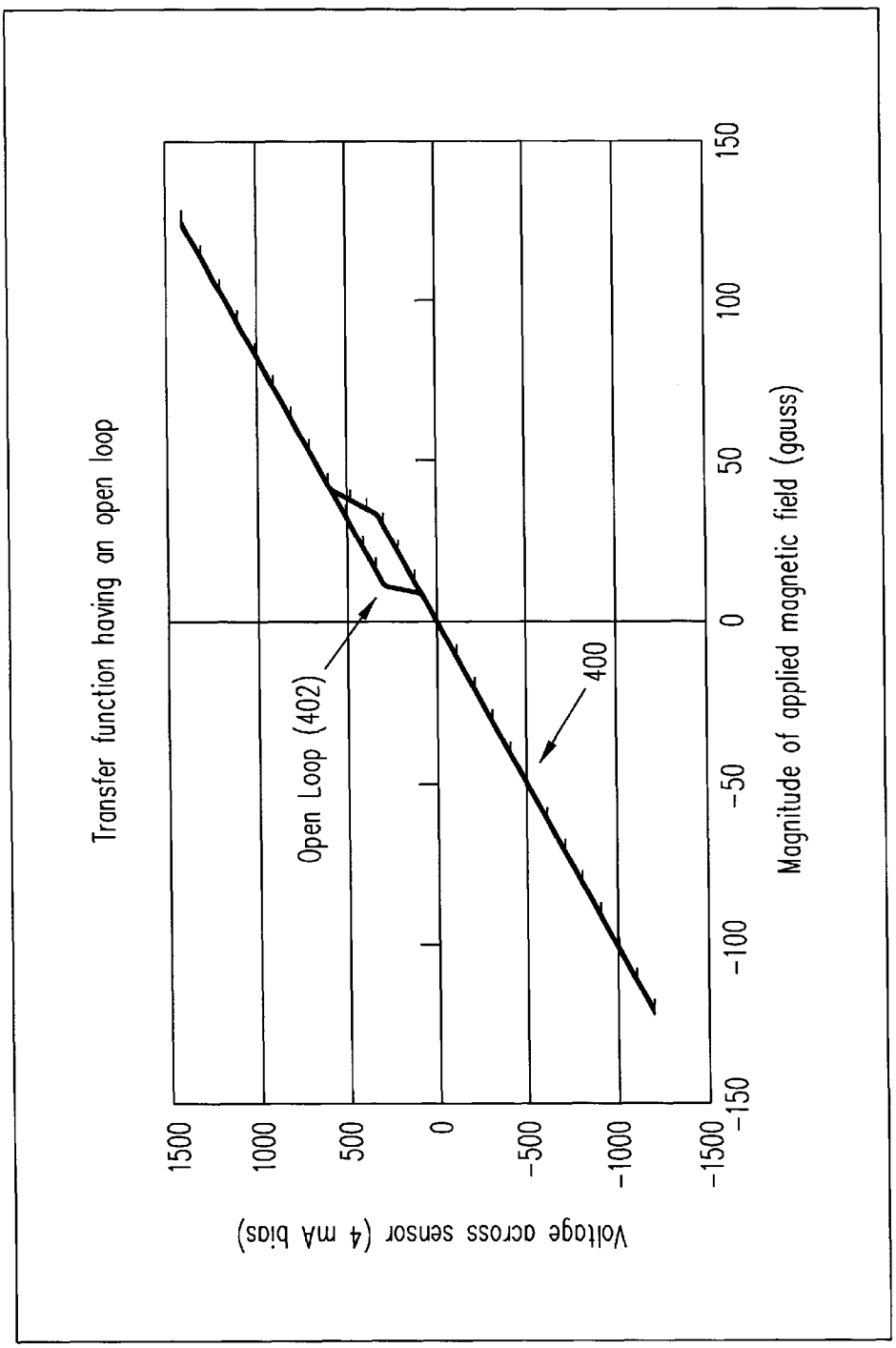
FIG. 4 shows a transfer curve having an open loop.

FIG. 4 shows an example of a typical transfer curve 400 of a sensor which shows an open loop 402. During a measurement of a transfer curve a kink may be observed at a certain field value as the applied field is increased from a minimum to a maximum value. However if the transfer curve is made as the external field is reduced from a maximum to a minimum value, the kink may not be observed at the same field magnitude. Accordingly there is hysteretic behavior and an open loop is observed in the transfer curve. Both kinks 302 and loops 402 are related phenomenon and are known generally as sensor response abnormalities. Sensor response abnormalities are generally caused by magnetic instabilities in the films comprising the sensor. These response abnormalities cause signal distortions which can generate errors when reading back data in a disk drive.

Figure 5:
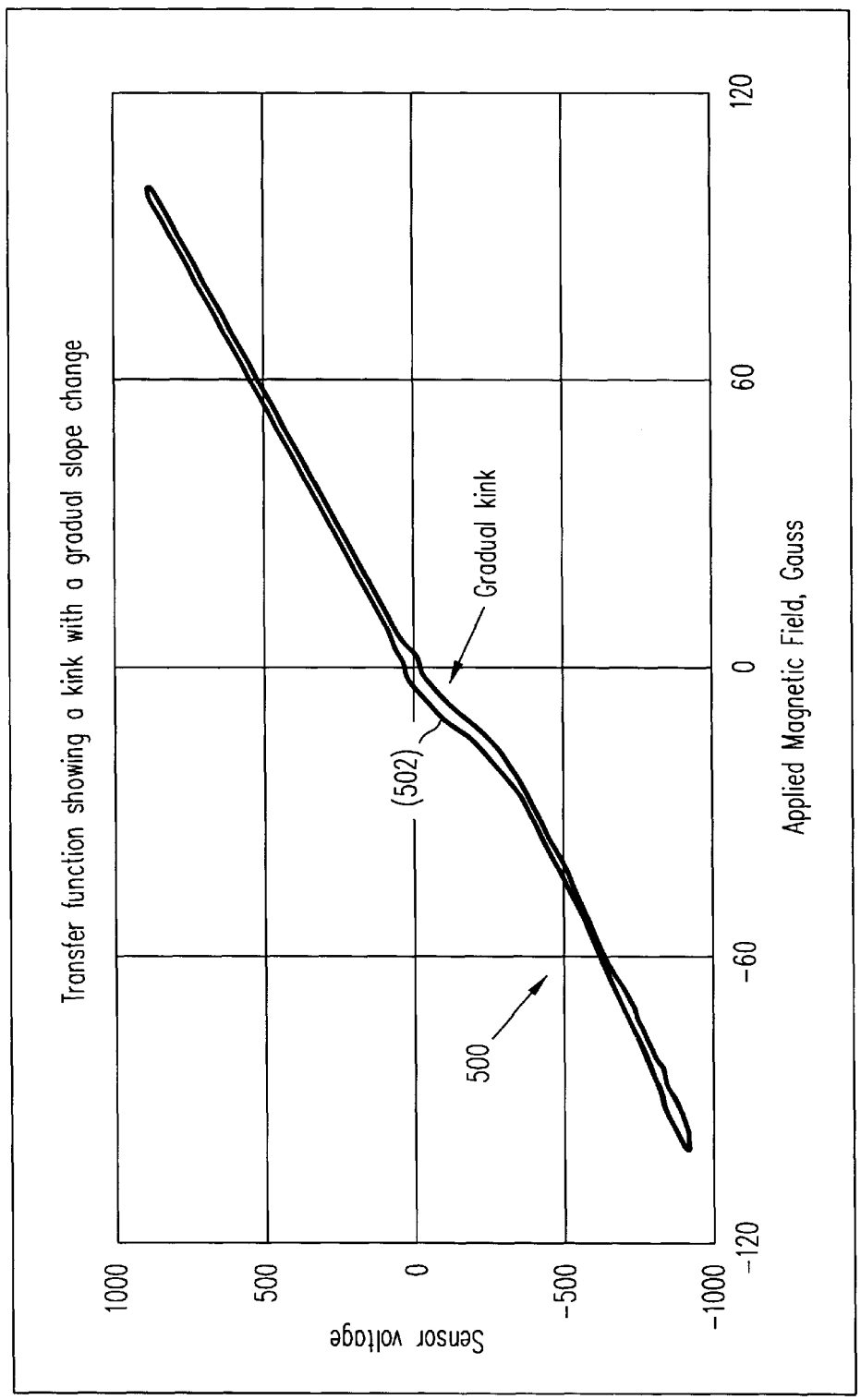
FIG. 5 shows a transfer curve having a gradual kink.

FIG. 5 shows a transfer curve 500 for a relatively small sensor which displays a kink 502. There is also a small amount of open loop behavior in the transfer curve 500. Because the sensor is small, the kink 502 is broader with respect to the applied field and the slope of the curve in the vicinity of the kink is not as large as in the case for the larger sensor illustrated in FIG. 3. The physical size of sensors must decrease as the required density of stored data on the disk increases. Since sensors in general are getting smaller with each new disk drive product and the kinks and other response abnormalities are becoming less well defined and more difficult to identify, it is highly desirable to improve the efficiency of detecting these response abnormalities.

Figure 6:
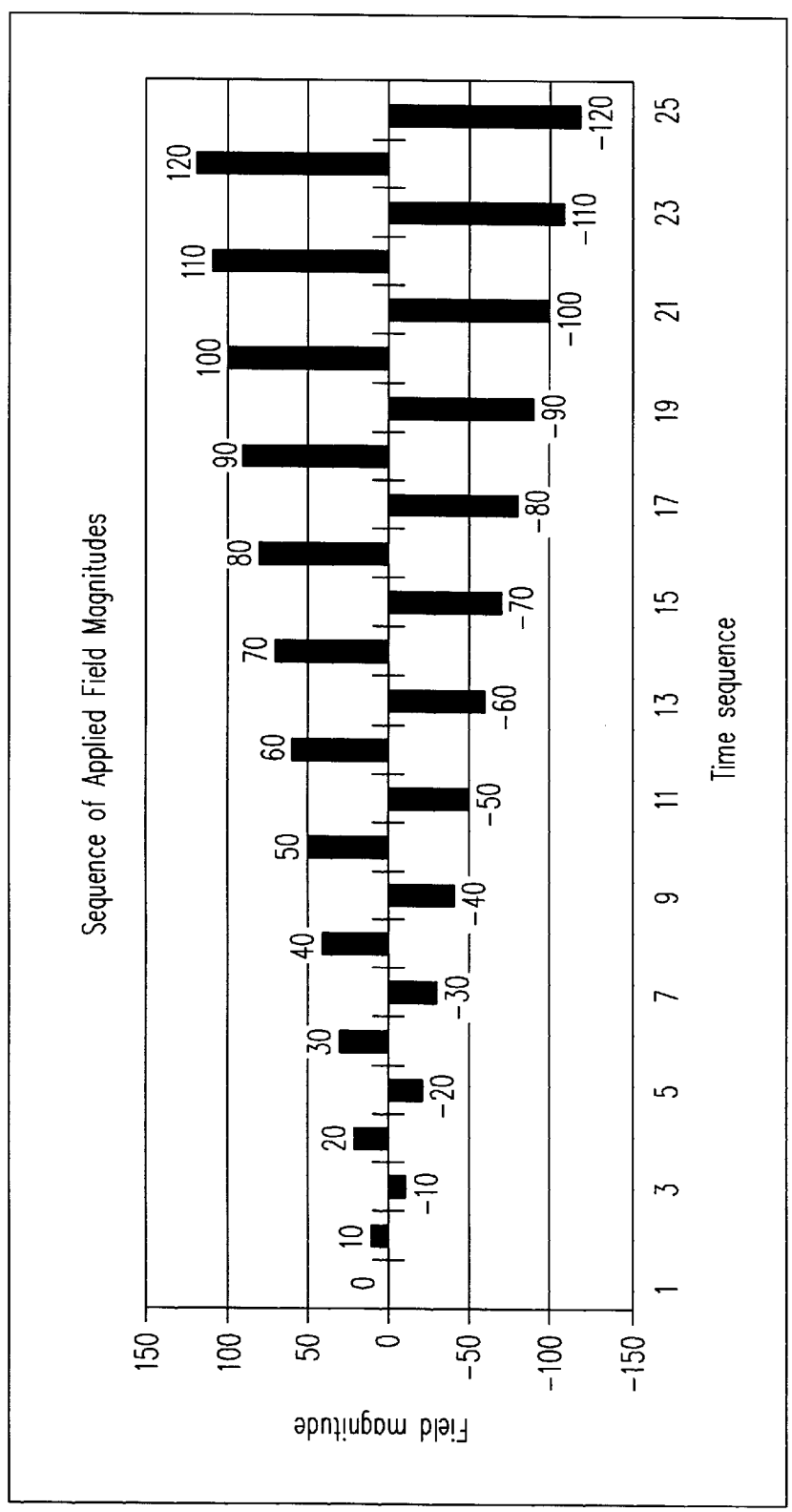
FIG. 6 shows an example of a sequence of applied magnetic field values.

It has been discovered that by alternating the applied magnetic field direction during the transfer curve measurements the kinks and other response abnormalities are more visible and easier to resolve. Accordingly, one aspect of the present invention is to alternate the applied magnetic field direction during the transfer curve measurements. One example of the sequence of applied magnetic field magnitudes and directions is illustrated in FIG. 6. In FIG. 6 the initial value of the applied field is about zero. It is also possible to choose an initial value of the field which is some other value such as close to the maximum value. Also in FIG. 6 the values of the intervals of the field values are approximately the same. This is convenient but not necessary; the values of each interval may be chosen independently.

Figure 10:
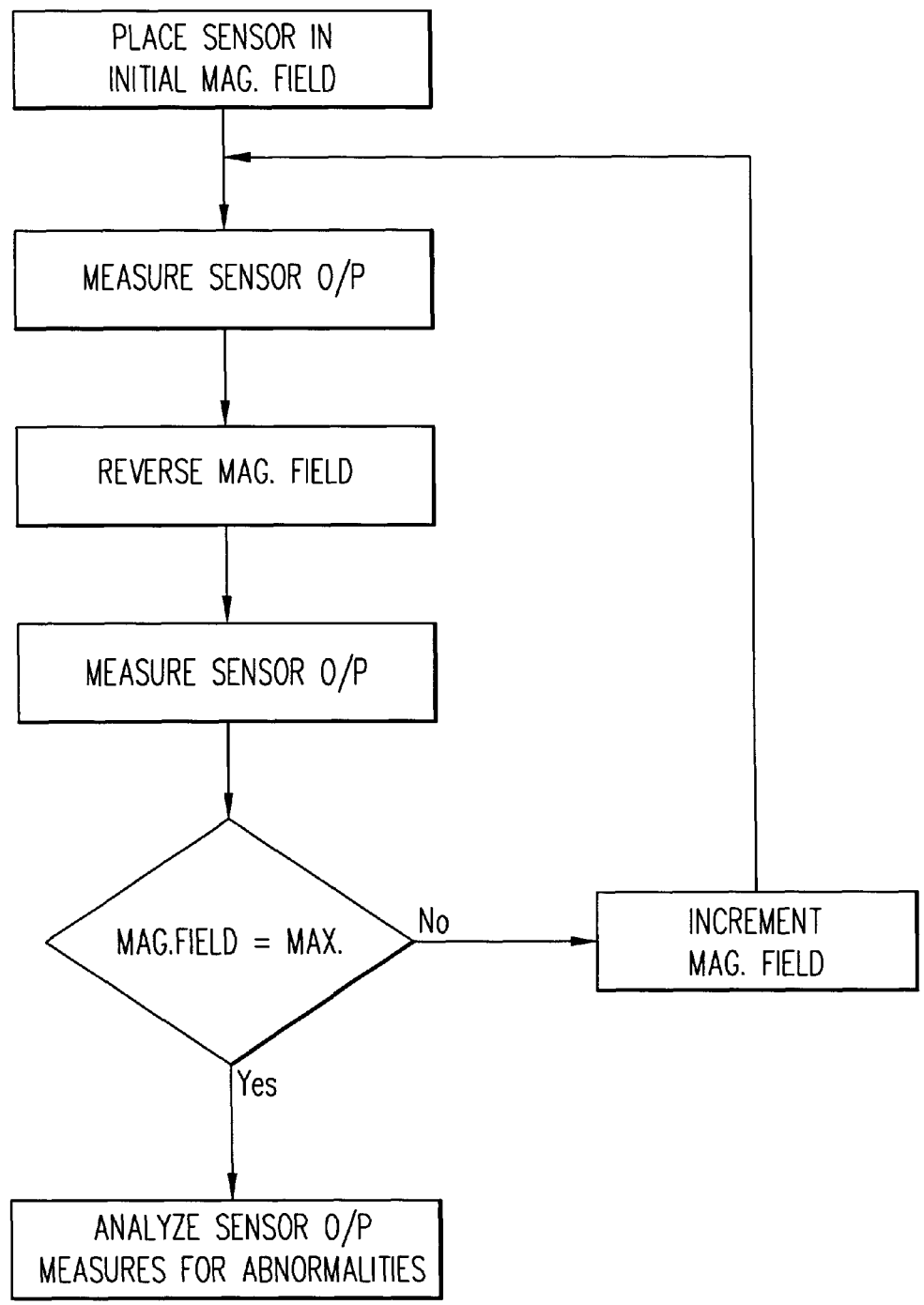
FIG. 10 shows a flowchart of a first method of testing a sensor for the presence of response abnormalities.

By way of explanation, the following method is one detailed example of constructing a transfer curve using the alternating field method. FIG. 10 is a flow chart illustrating a first method of detecting sensor abnormalities using the alternating field method.

1) A sensor is placed in a region where an external field is to be applied. The initial value is essentially zero.
2) A measurement is made of the sensor output. As discussed above, a voltage measurement across the sensor when applying a constant bias current is equivalent to measuring the resistance of the sensor.
3) The field is increased to +10 Oersteds and a sensor output measurement is made.
4) The field is reversed in direction with no change in magnitude to −10 Oersteds and a sensor output measurement is made.
5) The field magnitude is incrementally changed in magnitude and the direction is changed again so the applied field is now +20 Oersteds. A measurement of sensor output is made.
6) The field is reversed in direction but not in magnitude so that −20 Oersteds is applied and a sensor output measurement is made.
7) This sequence of alternating the direction of the applied field and gradually increasing the magnitude between sensor output measurements is continued until the maximum value of the applied field is obtained.

This method of alternating the field improves the detectability of the sensor abnormalities and is particularly useful for relatively small sensors. The specific example of field values shown in FIG. 6 shows a step size of 10 Oersteds. This is a convenient value, however the step size can be as small or large as desired to obtain the optimum tradeoff between speed of measurement and resolution of response abnormality. The incrementally changing step sizes of the magnetic field can also be varied during a measurement.

Figure 7:
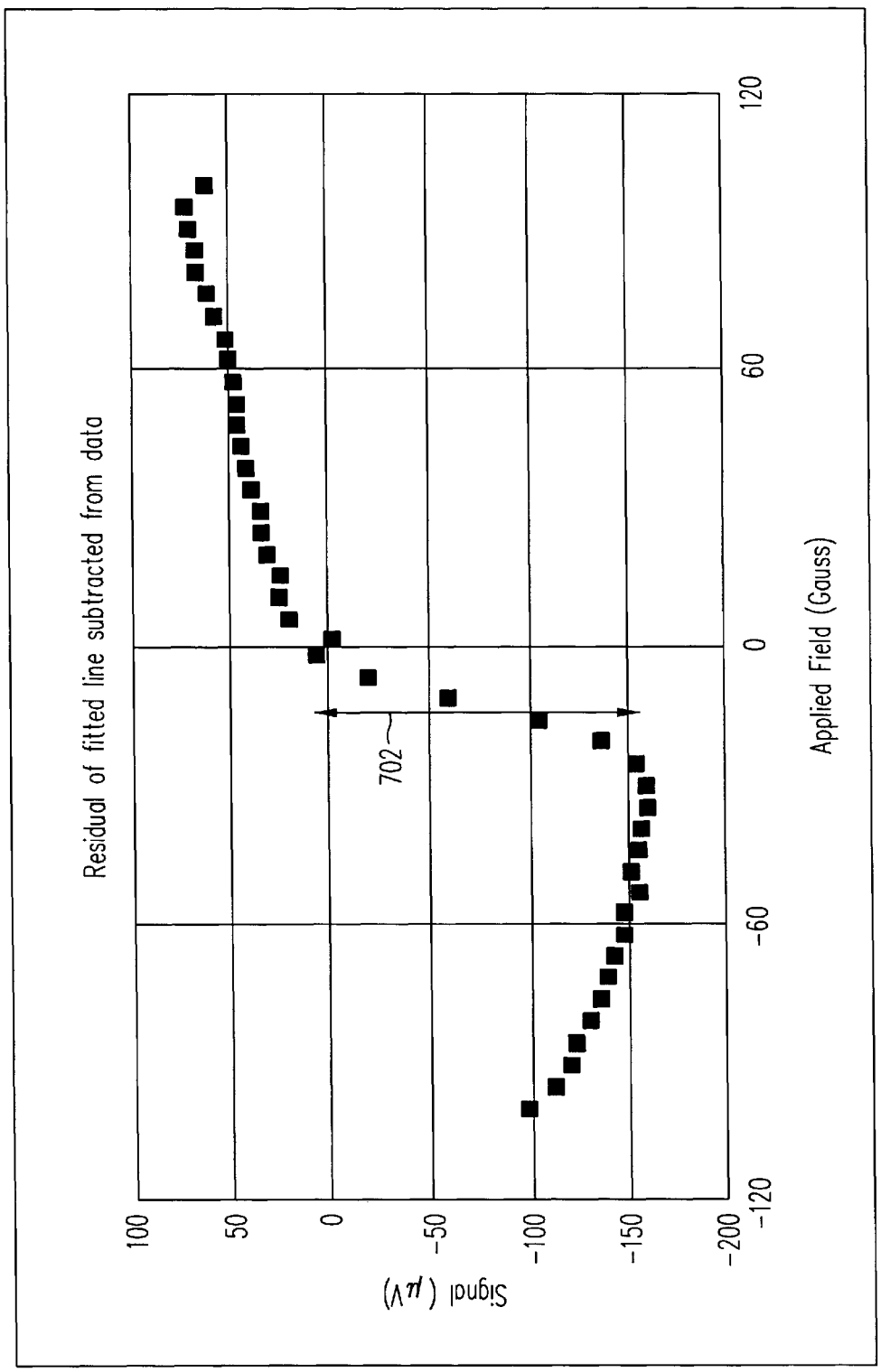
FIG. 7 shows the residual after subtracting a fitted line from a transfer curve indicating a kink; and, FIG. 8 shows a transfer curve having a kink and the corresponding point by point slope values.

One method of inspecting the transfer curve for response abnormalities is to fit a mathematical function to the experimental transfer curve. For example, the mathematical function can be as simple as a straight line. FIG. 7 shows the result of fitting a straight line to the data in FIG. 5 and subtracting that line from the data to form the residual. Whereas the signal ranged from nearly −1000 $\mu$V to almost +1000 $\mu$V, the residual only ranges from about −150 $\mu$V to about +100 $\mu$V. Because the range of the residual is much smaller than the range of the signal, the step 702 which occurs at an applied field magnitude of approximately −15 Oersteds is much more visible. A simple program can be written to make this inspection automatic. It has been discovered that if the data points in the vicinity of the steepest slope are eliminated when the straight line is fitted the results are more consistent. As discussed below the data points in the vicinity of a kink have more variability. It is also possible to fit a more complicated mathematical expression to the transfer curve data. For example three straight lines or a sloped arc tangent function may be fitted to the transfer curve data to achieve a more complete fit. The offset which represents a kink can then be parameterized and quantified from the data.

Figure 8:
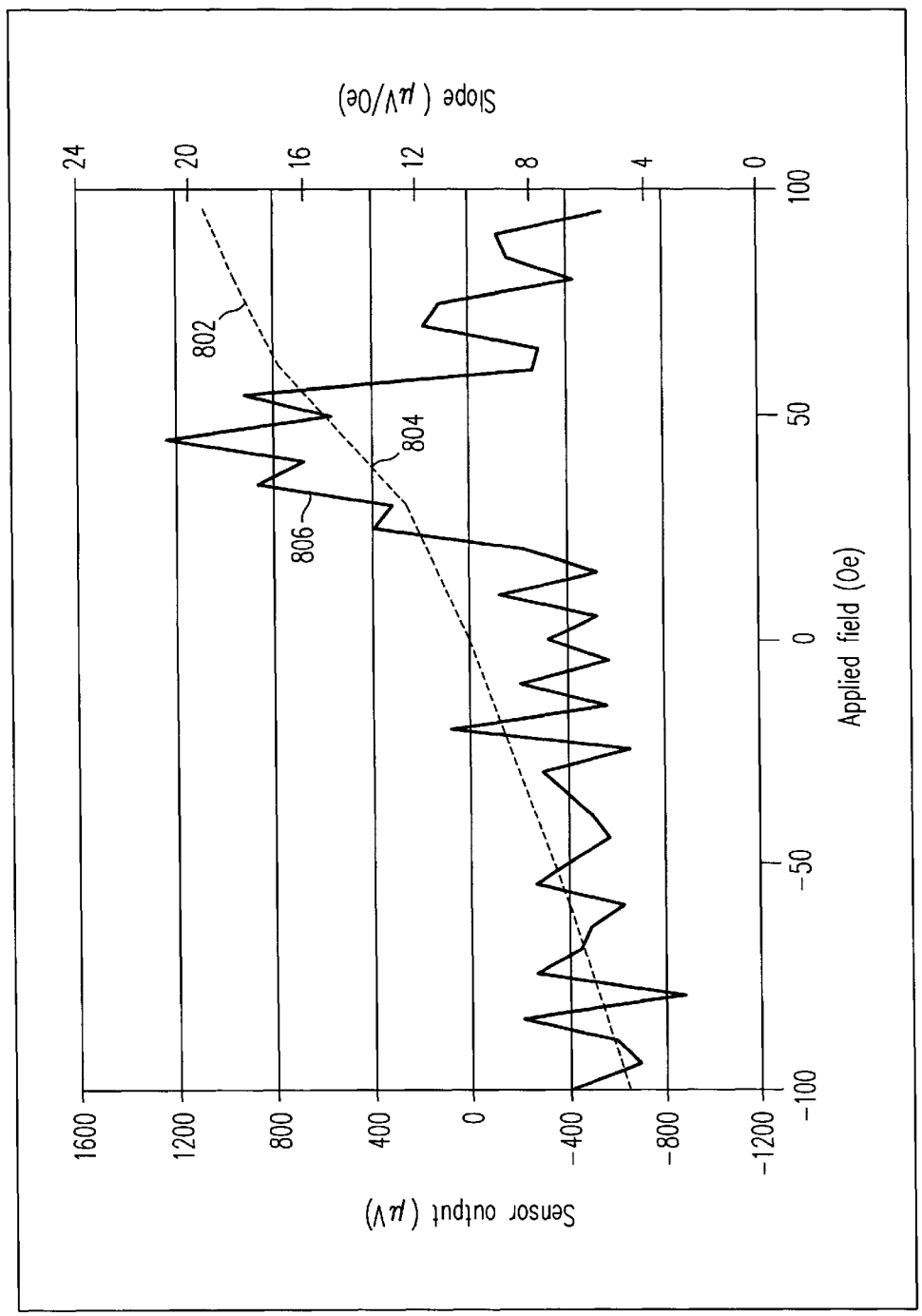

An alternative method of examining the transfer curve for the presence of kinks is to calculate the slope of the transfer curve at every interval of field value. This technique is illustrated in FIG. 8. The transfer curve is plotted as a dotted line 802. A gradual kink 804 can be seen in the transfer curve at an applied field of approximately 40 Oersteds. The slope of the transfer curve is plotted as a solid line 806. The magnitude of the slope increases substantially at approximately 40 Oersteds indicating the presence of a kink 804. This particular kink 804 would be easily detected with using an predetermined slope clip level of approximately 12 microvolts/Oe.

Figure 11:
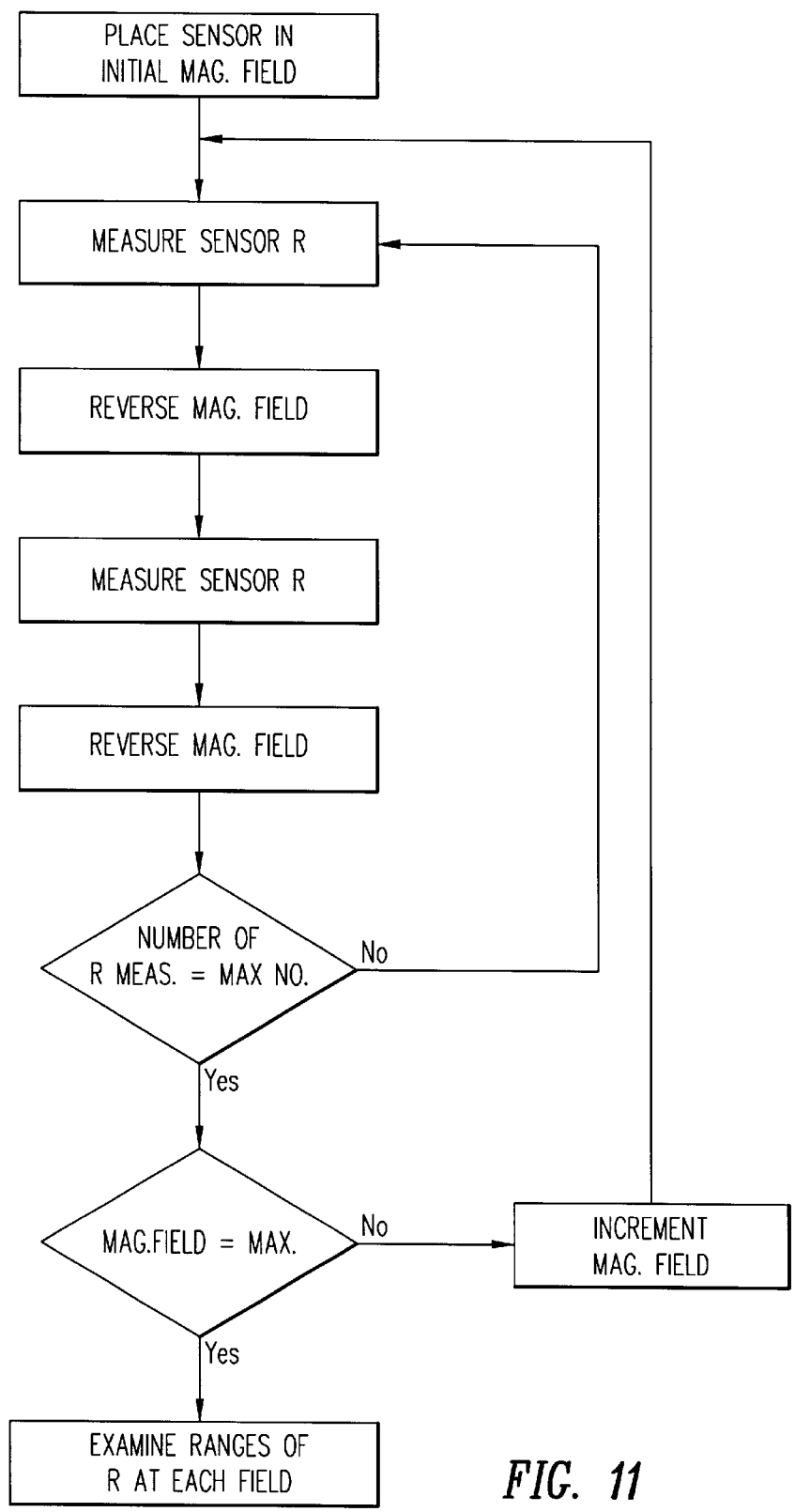
FIG. 11 shows a flowchart of a second method of testing a sensor for the presence of response abnormalities.

Another method of inspecting the transfer curve for response abnormalities is to examine the range of multiple values of transfer curve data points. By way of explanation the following is an example of incorporating the range inspection method with the technique of using an alternating field. FIG. 11 is a flowchart illustrating this method of testing a sensor for response abnormalities.

1) A sensor is placed in a region where an external field is applied. The initial value is essentially zero.
2) A measurement of the sensor output is made.
3) The field is increased to +10 Oersteds and a sensor output measurement is made.
4) The field is reversed in direction with no change in magnitude to −10 Oersteds and a sensor output measurement is made.
5) Steps 3 and 4 above are repeated without increasing the magnitude of the applied field until a preset number of measurements are made at that specific field magnitude.
6) The field is then incrementally changed in magnitude and a preset number of measurements of sensor resistance are made while alternating the field as described above.
7) This sequence of alternating the direction of the applied field, making a number of measurements of resistance, and gradually changing the magnitude of the applied field is continued until the maximum value of the applied field is obtained.

Figure 9:
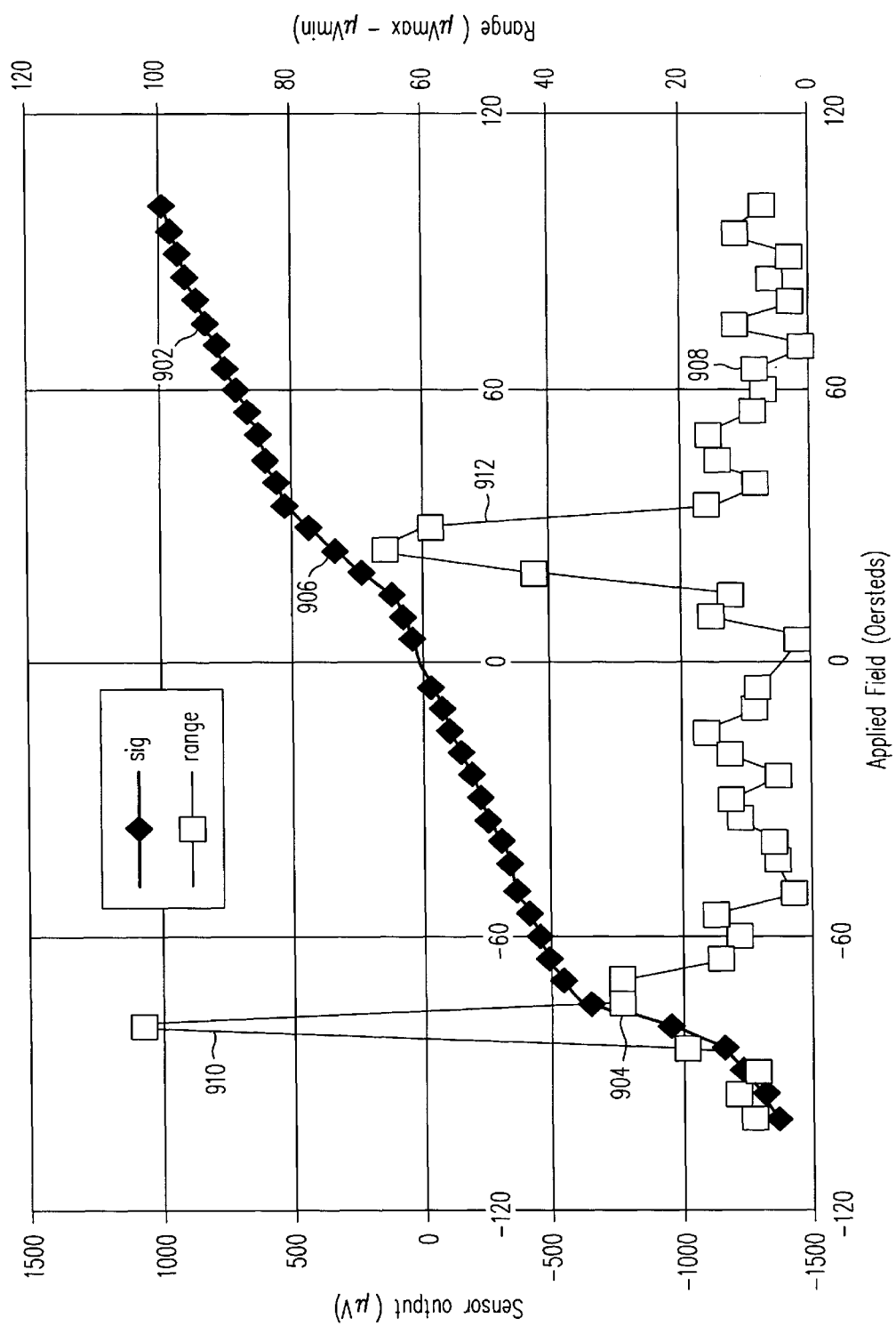
FIG. 9 shows a transfer curve having two kinks and the corresponding plot of range values.

In the example above the field increment is 10 Oersteds, however any convenient field increment can be used. An example of this method of testing for response abnormalities is shown in FIG. 9. In FIG. 9 the transfer curve 902 is plotted. Two kinks 904, 906 can be observed in the transfer curve 902. Also the range 908 of the resistance measurements is plotted as a function of applied field magnitude. In the range plot 908 two areas 910, 912 are shown which have exceptionally high values. The location of the peaks 910, 912 in the range plot correspond to the location of the kinks 904, 906. The instabilities which are responsible for the sensor response abnormalities are associated with exceptional variability in the resistance measurements.

As a practical implementation of a testing method, the range plot of the voltage measurements is constructed. The number of measurements to be collected at each applied field magnitude can be chosen as a compromise between testing time and statistical significance. In FIG. 9 sixteen measurements were taken at each field value. Then a clip level for the range is chosen. Again using the data from FIG. 9 a range of greater than about 60 $\mu$V would have been effective in identifying both kinks in the transfer curve.

From the foregoing it will be appreciated that the method for testing the sensor for response abnormalities as provided by the present invention is efficient and effective and is a significant improvement in the art. Sensors can now be tested with confidence and assurance that response abnormalities will be discovered.

What is claimed is:

1. A method of testing a magnetic sensor for the presence of a response abnormality of the sensor to an applied magnetic field, comprising:

placing the sensor in the applied magnetic field;

incrementally changing the value of the applied magnetic field;

wherein at each value of the applied magnetic field a first measurement of the sensor output is made, then the direction of the field is reversed, and a second measurement of the sensor output is made; and, determining the presence of a response abnormality by examining the sensor output measurements.

2. A method as in claim 1 wherein the determination of the presence of response abnormalities is made by fitting a straight line to the sensor output values as a function of the applied field;

subtracting the fitted line from the sensor output values to form residual values;

examining the residual values for response abnormalities.

3. A method as in claim 2 wherein the sensor output values near the region of the highest slope of the curve of the sensor output values as a function of applied field are excluded for the purpose of fitting the straight line.

4. A method as in claim 2 wherein the value of said applied magnetic field is changed from about zero to about 120 Oersteds.

5. A method of testing a magnetic sensor for the presence of a response abnormality of the sensor to an applied magnetic field, comprising:

placing the sensor in the applied magnetic field;

incrementally changing the value of the applied magnetic field;

wherein at each value of the applied magnetic field a first measurement of the sensor output is made, then the direction of the field is reversed, and a second measurement of the sensor output is made; and, creating a transfer curve by plotting the value of the sensor output vs the value of the applied field;

determining a slope of the transfer curve at each value of the applied magnetic field; and, determining if any value of the slope exceeds a predetermined value.

6. A method of testing for the presence of response abnormalities of a magnetic sensor to an applied magnetic field, comprising:

placing the sensor in an applied magnetic field;

incrementally changing the value of the applied magnetic field through a range of about zero to a preselected maximum value;

measuring multiple values of resistance at each value of the applied magnetic field by repeatedly performing the sequence of,
   a) making a resistance measurement of the sensor,
   b) reversing the direction of the field,
   c) making another resistance measurement of the sensor, and
   d) reversing the field back to the first direction; and, determining the presence of abnormalities by examining the range of resistance values at each field value.

7. A method as in claim 6 wherein the value of said preselected maximum magnetic field is approximately 120 Oersteds.

* * * * *